United States Patent
Reboh et al.

(10) Patent No.: US 9,966,453 B2
(45) Date of Patent: May 8, 2018

(54) METHOD FOR DOPING SOURCE AND DRAIN REGIONS OF A TRANSISTOR BY MEANS OF SELECTIVE AMORPHISATION

(71) Applicant: Commissariat A L'Energie Atomique et aux Energies Alternatives, Paris (FR)

(72) Inventors: Shay Reboh, Grenoble (FR); Perrine Batude, Dijon (FR); Frederic Mazen, Saint Egreve (FR); Benoit Sklenard, Grenoble (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 43 days.

(21) Appl. No.: 15/092,002

(22) Filed: Apr. 6, 2016

(65) Prior Publication Data
US 2016/0300927 A1   Oct. 13, 2016

(30) Foreign Application Priority Data

Apr. 9, 2015 (FR) .................................. 15 53049

(51) Int. Cl.
*H01L 21/00* (2006.01)
*H01L 29/66* (2006.01)
(Continued)

(52) U.S. Cl.
CPC .... *H01L 29/66477* (2013.01); *H01L 21/0257* (2013.01); *H01L 21/02532* (2013.01);
(Continued)

(58) Field of Classification Search
CPC ......... H01L 29/66477; H01L 21/02532; H01L 21/0257; H01L 21/02667; H01L 21/26506;
(Continued)

(56) References Cited

U.S. PATENT DOCUMENTS 6,403,433 B1   6/2002 Yu et al.
9,246,006 B2 *   1/2016 Batude .............. H01L 21/26513
(Continued)

FOREIGN PATENT DOCUMENTS

EP   2 840 594 A2   2/2015

OTHER PUBLICATIONS

U.S. Appl. No. 14/450,385, filed Aug. 4, 2014, 2015/0044841 A1, Perine Batude et al.
(Continued)

*Primary Examiner* — Caleb Henry
*Assistant Examiner* — Alexander Belousov
(74) *Attorney, Agent, or Firm* — Oblon, McClelland, Maier & Neustadt, L.L.P.

(57) ABSTRACT

Method including the steps consisting in:
forming source and drain semiconductor blocks comprising a first layer based on a first crystalline semiconductor material surmounted by a second layer (16) based on a second crystalline semiconductor material different from the first semiconductor material,
making amorphous and selectively doping the second layer (16) by means of one or more implantation(s),
carrying out a recrystallisation of the second layer and an activation of dopants by means of at least one thermal annealing.

13 Claims, 3 Drawing Sheets

(51) Int. Cl.
  *H01L 21/02* (2006.01)
  *H01L 21/324* (2006.01)
  *H01L 29/06* (2006.01)
  *H01L 29/417* (2006.01)
  *H01L 29/786* (2006.01)
  *H01L 21/265* (2006.01)

(52) U.S. Cl.
  CPC .. *H01L 21/02667* (2013.01); *H01L 21/26506* (2013.01); *H01L 21/324* (2013.01); *H01L 29/0649* (2013.01); *H01L 29/41783* (2013.01); *H01L 29/66628* (2013.01); *H01L 29/66772* (2013.01); *H01L 29/78618* (2013.01); *H01L 21/26513* (2013.01)

(58) Field of Classification Search
  CPC ............... H01L 21/324; H01L 29/0649; H01L 29/41783; H01L 29/66628; H01L 29/66772; H01L 29/78618; H01L 21/26513
  See application file for complete search history.

(56) References Cited

U.S. PATENT DOCUMENTS

| | | |
|---|---|---|
| 2007/0045729 A1 | 3/2007 | Hoentschel et al. |
| 2007/0096194 A1 | 5/2007 | Streck et al. |
| 2008/0070370 A1 | 3/2008 | Wu et al. |
| 2010/0193882 A1 | 8/2010 | Hoentschel et al. |
| 2012/0068193 A1 | 3/2012 | Chan et al. |
| 2013/0137243 A1 | 5/2013 | Yang et al. |
| 2014/0099763 A1 | 4/2014 | Alptekin et al. |
| 2015/0044828 A1* | 2/2015 | Batude .............. H01L 21/26513 438/166 |

OTHER PUBLICATIONS

U.S. Appl. No. 14/555,897, filed Nov. 28, 2014, 2015/0155170 A1, Shay Reboh et al.
U.S. Appl. No. 14/575,329, filed Dec. 18, 2014, 2015/0179474 A1, Sylvain Maitrejean et al.
U.S. Appl. No. 14/579,069, filed Dec. 22, 2014, 2015/0179665 A1, Shay Reboh et al.
U.S. Appl. No. 14/791,713, filed Jul. 6, 2015, 2016/0005862 A1, Shay Reboh et al.
U.S. Appl. No. 14/802,283, filed Jul. 17, 2015, 2016/0020153 A1, Perine Batude et al.
U.S. Appl. No. 14/950,416, filed Nov. 24, 2015, Shay Reboh et al.
U.S. Appl. No. 14/950,833, filed Nov. 24, 2015, Shay Reboh et al.
U.S. Appl. No. 14/976,958, filed Dec. 21, 2015, Fabien Deprat et al.
U.S. Appl. No. 15/070,781, filed Mar. 15, 2016, Sylvain Barraud et al.
U.S. Appl. No. 15/092,002, filed Apr. 6, 2016, Shay Reboh et al.
French Preliminary Search Report dated Feb. 4, 2016 in French Application 15 53049, filed on Apr. 9, 2015 ( with English Translation of Categories of Cited documents).
T.W. Simpson et al. "Amorphization threshold in Si-implanted strained SiGe alloy layers", EMRS 94, 1994, 9 pages.
C. Jahan et al. Agglomeration control during the selective epitaxial growth of Si raised sources and drains on ultra-thin silicon-on-insulator substrates, Journal of Crystal growth 280, 2005, 9 pages.
L. Grebouillet et al. "Enabling epitaxy on ultrathin implanted SOI", CEA-LETI, IBM, ST Microelectronics, 2 pages.

* cited by examiner

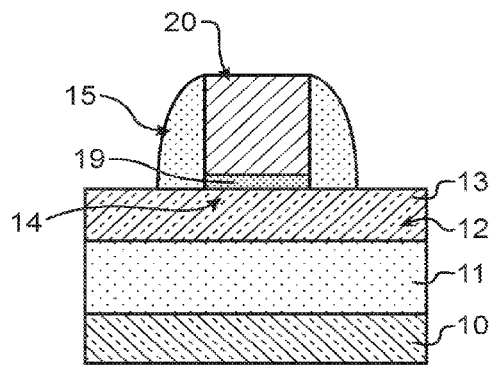
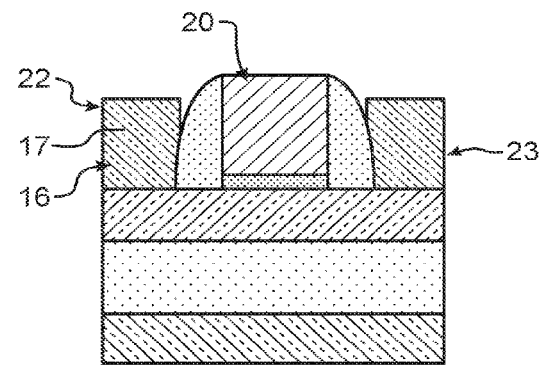
FIG.1A  FIG.1B
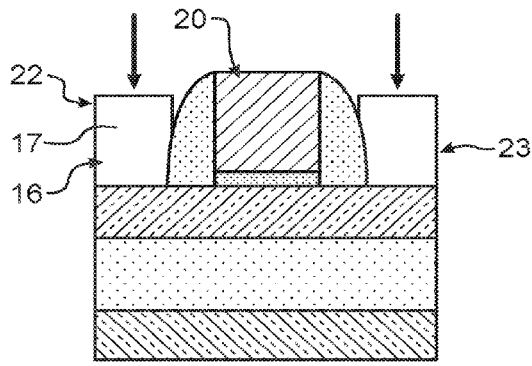
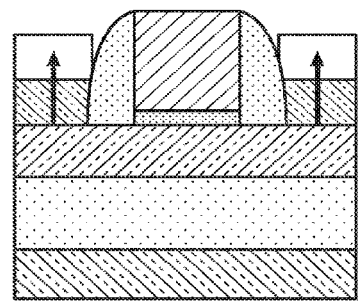
FIG.1C  FIG.1D
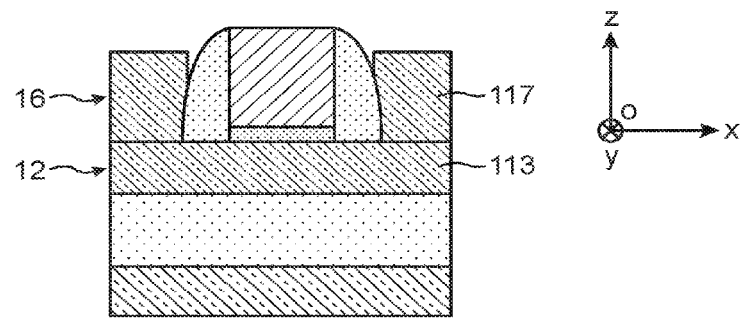
FIG.2

METHOD FOR DOPING SOURCE AND DRAIN REGIONS OF A TRANSISTOR BY MEANS OF SELECTIVE AMORPHISATION

TECHNICAL FIELD AND PRIOR ART

The present invention relates to the field of microelectronics and more particularly to that of methods of manufacturing transistors.

In order to improve the performances of a transistor implemented on a semiconductor on insulator type substrate, for example of SOI type (SOI for "silicon on insulator"), it is known to form raised source and drain blocks, that is to say that they are formed at least in part in semiconductor blocks which extend on either side of a gate, above a superficial semiconductor layer of the substrate in which the channel of the transistor is provided.

At the same time, it may prove to be necessary or at least preferable to manufacture transistors using the lowest possible thermal budget in order not to deteriorate their performances.

A doping of raised source and drain blocks at low thermal budget may in particular be envisaged.

To do so, a method may consist firstly in carrying out one or more ion implantations of which at least one implantation of dopants, these implantations having a tendency to damage the crystalline structure of the doped semiconductor material and to make it amorphous. Then, a recrystallisation leading to an activation of the dopants in the amorphous semiconductor material may then be carried out at low temperature, in particular less than 650° C. This method is known under the denomination SPER for "Solid-Phase Epitaxial Recrystallisation".

If the source and drain blocks are amorphised by implantation over their whole thickness, that is to say down to an insulating layer of the semiconductor on insulator substrate, a monocrystalline recrystallisation of the material made amorphous will be impossible to implement.

To resolve this problem, it is provided in the document EP2840594 A1, to carry out a buried ion implantation of the source and drain blocks so as to form a lower amorphous region situated on an upper zone of which the crystalline structure has been conserved. Then, a recrystallisation of this lower region is carried out using the upper crystalline zone as starting zone of recrystallisation fronts.

Alternatively, it is possible to carry out an ion implantation of source and drain blocks so as to form an upper amorphous zone while keeping a lower region of which the crystalline structure is conserved, then, to carry out a recrystallisation of the upper zone using the lower crystalline region as starting region of recrystallisation fronts. But in this case, this may necessitate conserving a high thickness of crystalline material seed near to the insulating layer of the substrate in order to make it possible to properly recrystallize the upper amorphous zone.

The problem is posed of finding a novel method enabling the doping of source and drain regions of a transistor which is improved compared to the above described methods.

DESCRIPTION OF THE INVENTION

An embodiment of the present invention provides a method for forming doped source and drain blocks of a transistor including the steps consisting in:
  providing a structure including semiconductor blocks intended to produce source and drain blocks arranged on either side of a semiconductor zone in which a channel of the transistor is able to be produced, the semiconductor blocks comprising a first layer based on a first crystalline semiconductor material surmounted by a second layer based on a second crystalline semiconductor material different from the first semiconductor material,
  making amorphous and doping the second layer by means of one or more implantation(s), the amorphisation being a selective amorphisation of the second semiconductor material carried out so as to conserve the crystalline structure of the first semiconductor material,
  carrying out a recrystallisation of the second layer and an activation of dopants by means of at least one thermal annealing.

A selective amorphisation of the second layer with respect to the first layer may be carried out by choosing in a suitable manner the first semiconductor material, the second semiconductor material, as well as the parameters of the implantation(s), in particular the temperature, the species implanted, the dose, the energy and the implantation current.

To enable a selective amorphisation preferably the first semiconductor material is chosen based on $Si_{1-x}Ge_x$ (with $1>x\geq0$), whereas the second semiconductor material is based on $Si_{1-y}Ge_y$, with $y>0$, the concentrations x and y of Ge being such that: $|y-x|\geq0.1$ The interface between the first layer and the second layer here corresponding to the interface between the region made amorphous and the zone of which the crystalline structure has been conserved.

Through the selective amorphisation, this interface between amorphous region and crystalline zone is defined in a precise manner and it is possible to obtain a substantially flat interface, and to make it possible thereafter to properly recrystallize the second layer. The interface between the first layer and the second layer is here used as starting zone for the recrystallisation front.

The second layer is preferably formed on thinned regions of the first layer. It is thus possible to implement a doping as close as possible to the zones situated under the spacers and to produce a transistor with reduced access resistances to the channel.

Said structure may comprise a gate block and first insulating spacers laid out on either side of the gate block and lying on a given zone of the first layer. In this case, the method may further include prior to the step consisting in providing the structure, the steps consisting in:
  thinning the first layer on either side of the given zone,
  forming the second layer on the first layer.

Advantageously, after thinning of the first layer and prior to the formation of the second layer, the method may include a step consisting in:
  removing a thickness of the regions of the first layer on either side of the spacers and a part of the given zone situated facing the spacers.

It is thus possible to form a second layer closer to the channel zone, and thereafter to have access zones to the channel of reduced resistance.

According to a possibility of implementation of the method, the formation of the second layer may include at least one first growth by epitaxy of the second semiconductor material up to at least the level of an upper face of the given zone of the first layer on which lies a gate of the transistor.

According to a possibility of implementation of the method, after the first growth by epitaxy it is possible to carry out an amorphisation of the second semiconductor material which is selective with respect to the first semiconductor material.

According to a possibility of implementation of the method, after the first growth by epitaxy a second growth by epitaxy may be carried out such as to form a third semiconductor layer on the second semiconductor layer.

According to a possibility of implementation of the method, after the first growth by epitaxy and prior to the second growth by epitaxy, it is possible to form second insulating spacers against the first insulating spacers.

According to a possibility of implementation of the method, during the second growth by epitaxy, an in-situ doping of the third semiconductor layer may be carried out.

In a variant, after the second growth by epitaxy a selective amorphisation of the third semiconductor layer and the second semiconductor material may be carried out with respect to the first semiconductor material.

According to a possibility of implementation of the method, after the first growth by epitaxy and prior to the second growth by epitaxy a doping of the second semiconductor material is carried out by amorphisation and recrystallisation.

Preferably, in order to obtain a good amorphisation selectivity, the first semiconductor material has a concentration x of Ge less than 25%, whereas the second semiconductor material has a concentration greater than 35% of Ge.

According to a possibility of implementation of the method when the transistor is of NMOS type, the first semiconductor material may be based on Si whereas the second semiconductor material is based on $Si_{1-y}Ge_y$, with $5\%<y<15\%$.

In this case, a third semiconductor layer may be formed on the second semiconductor layer and provided based on a material, such as Si:C, adapted to induce a tensile stress in the channel zone.

According to another possibility of implementation of the method, when the transistor is of PMOS type, the first semiconductor material may be based on Si whereas the second semiconductor material is based on $Si_{1-y}Ge_y$ with $y>20\%$, or instead the first material may be based on $Si_{1-x}Ge_x$ with $x<25\%$ and the second material is $Si_{1-y}Ge_y$ with $y>35\%$.

In this case, a third semiconductor layer may be formed on the second semiconductor layer and provided based on a material, such as $Si_{1-z}Ge_z$ with $y\leq z$, adapted to induce a compressive stress in the channel zone.

A method for producing a transistor may thus include a method for producing source and drain blocks as defined above.

An embodiment of the invention also provides a microelectronic device implemented by means of a method as defined above.

BRIEF DESCRIPTION OF THE DRAWINGS

The present invention will be better understood on reading the description of examples of embodiment, given for indicative purposes and in no way limiting, and by referring to the appended drawings in which:

FIGS. 1A-1D illustrate a first example of method according to an embodiment of the invention in which doped source and drain blocks are formed for a PMOS type transistor, this formation including a selective amorphisation of a semiconductor layer with respect to another semiconductor layer on which it is stacked in order to define precisely an interface between an amorphised zone and a crystalline region;

FIG. 2 illustrates a second example of method adapted for the implementation of doped source and drain blocks for a NMOS type transistor, the amorphisation being carried out on a stack of semiconductor materials different from that of the first example of method;

Figures 3A, 3B, 3C, 3D:
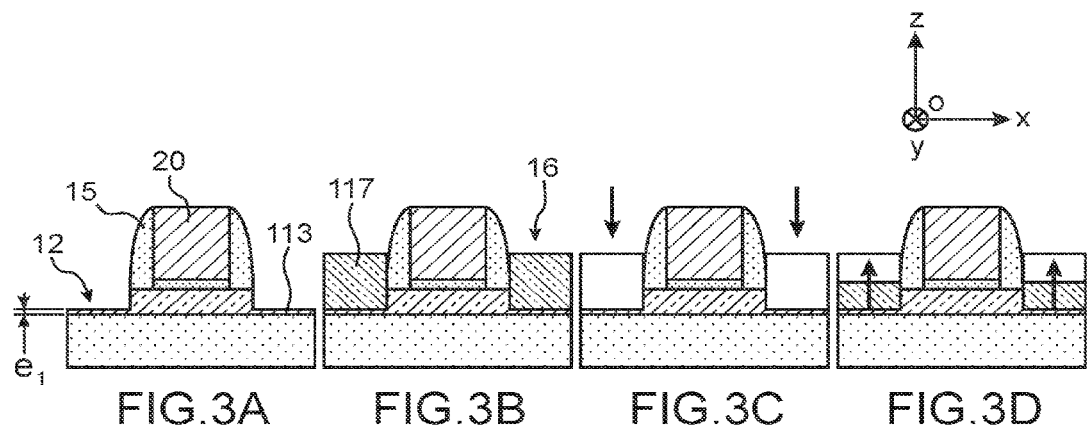
FIGS. 3A-3D illustrate an advantageous embodiment in which a removal of a portion of superficial semiconductor layer is carried out on either side of the spacers of the transistor in order to lower the interface between amorphised zone and crystalline region and to be able to carry out a doping as close as possible to the access zones to the channel.

Identical, similar or equivalent parts of the different figures bear the same numerical references in order to make it easier to go from one figure to the next.

The different parts represented in the figures are not necessarily according to a uniform scale in order to make the figures more legible.

DETAILED DESCRIPTION OF PARTICULAR EMBODIMENTS

A first example of method for producing doped source and drain blocks of a transistor will now be described in relation with FIGS. 1A-1D.

In this example, the transistor that is manufactured is of PMOS type.

FIG. 1A illustrates a possible starting structure of this example of method. This structure may be formed from a semiconductor on insulator type substrate, for example of SiGeOI type, which includes a semiconductor support layer 10, an insulating layer 11 which may be based on silicon oxide and is arranged on and in contact with the support layer 10. The insulating layer 11 of the substrate may in particular be a BOX (BOX for "Buried Oxide") or TBOX (TBOX for "Thin Buried Oxide") type layer. The substrate also comprises a superficial semiconductor layer 12 based on a first crystalline semiconductor material 13. The superficial semiconductor layer 12 is situated on, and in contact with, the insulating layer 11 of the substrate. The superficial semiconductor layer 12 may have a thickness comprised for example between 3 and 40 nm, in particular between 4 nm and 10 nm or of the order of 6 nm. The superficial semiconductor layer 12 may be based on $Si_{1-x}Ge_x$ with x>0 and in particular less than 25%, for example of the order of 15 to 20%.

Steps of deposition of a gate dielectric layer 19 and of one or more gate material(s), then etching of these layers in order to form a gate block 20 facing a zone 14 of the superficial semiconductor layer 12 intended to form a channel for the transistor are then carried out. The gate block 20 of the transistor may be formed of a stack including an oxide layer on which lies a metal layer, for example based on TiN, on which lies a semiconductor layer, for example based on polysilicon. Insulating spacers 15, for example based on silicon nitride, are also formed against the lateral sides of the gate block 20 and lie on the superficial semiconductor layer 12.

Then, from the structure illustrated in FIG. 1A, a layer 16 based on a second crystalline semiconductor material 17 is grown by epitaxy on the superficial semiconductor layer 12 (FIG. 1B).

The second semiconductor material 17 is different from the first semiconductor material 13. The second semiconductor material 17 may be based on $Si_{1-y}Ge_y$ with a concentration y of germanium different from that of the first crystalline semiconductor material. The second semiconductor material 17 may have a concentration y of Ge preferably greater than 35% and for example of the order of 40 to 50%.

In this way are formed with this semiconductor layer 12, semiconductor blocks intended to form raised source and drain blocks arranged on either side of the channel zone and the spacers 15. The thickness of the layer 16 based on the second semiconductor material 17 may be comprised for example between 10 and 30 nm.

Then, an amorphisation of the layer 16 based on the second crystalline semiconductor material 17 is carried out by means of one or more ion implantations.

The difference y−x in concentration of Ge between the two semiconductor layers 12 and 17 is chosen such that, during the amorphisation with a given ionic species, given dose, given energy, given implantation current and given temperature, only the layer 16 based on the second semiconductor material 17 with higher Ge concentration is amorphised. The layer 12 based on the first semiconductor material 13 then corresponds to a region left crystalline. A selective amorphisation is thus carried out by choosing x, y, the implanted dose, the implantation energy, the implantation current, the implantation temperature and the implanted ion.

Such amorphisation selectivity is evoked in the document: "*Amorphization threshold in Si implanted strained SiGe alloy layers*", of T. W. Simpson et al., EMRS 94, Boston.

Those skilled in the art will know how to obtain experimental curves to determine the difference in concentration of Ge, as a function of the value of the dose and the temperature to obtain a selective amorphisation.

In order to make it possible to obtain a good amorphisation selectivity, the difference in concentration in absolute value |y−x| between the first crystalline semiconductor material 13 and the second crystalline semiconductor material 17 is preferably greater than or equal to 10%.

The fact of working at higher temperature can make it possible to gain in selectivity.

Those skilled in the art will know how to obtain experimental curves at given difference in concentration of Ge, dose, energy and implantation temperature to obtain a selective amorphisation.

At fixed dose and energy, the temperature at which the substrate is placed may in particular be adapted in order to modify the amorphisation selectivity.

The document of Simpson referenced above gives for example temperature and dose windows to make it possible, for a given energy, to amorphise selectively $Si_{1-y}Ge_y$ with y=0.15 compared to Si or to make it possible, for a given energy, to amorphise selectively $Si_{1-y}Ge_y$ with y=0.29 with respect to Si.

By means of such a selective amorphisation, an interface between the amorphised zone and the region which has remained crystalline is obtained which is well defined and corresponds to the interface of the two layers 12 and 16. The interface between amorphised zone and crystalline region is thus precisely located and has a reduced roughness.

According to a possibility of implementation of the method of selective amorphisation, the innplantation(s) of the second semiconductor material 17 may be carried out by means of at least one doping species such as for example P or As. In this case, the second semiconductor material 17 is doped at the same time as this material is made amorphous.

In a variant, a selective amorphisation of the second semiconductor material 17 is carried out by means of one or more implantation(s) of non-doping species for example such as Ge or Si. In this case, to dope the second semiconductor material 17 it is possible then, or beforehand, to carry out one or more other implantations by means of one or more doping species. This other or these other implantation(s) of dopants may be carried out at high temperature in order to optimise the profile of dopants with carrying out an amorphisation.

It is also possible to carry out the selective amorphisation and to obtain an amorphisation profile partially by means of at least one first implantation of a first species, for example a doping species, this amorphisation profile then being modified by means of at least one other implantation of another species, for example a non-doping species.

During the implantation(s), one or more transistors (not represented) of a type different from that of which the manufacture is here described, for example an N type transistor, may be protected by means of a masking (not represented). This masking is preferably based on a material which may be removed after the implantation(s). An example of such a material is amorphous carbon with a hydrogen atomic concentration less than 15%. This material may be removed by means of a plasma based on oxygen and may be done so without damaging the other layers and in particular the layers of silicon oxide, silicon nitride and the semiconductor layers. It is possible in a variant to use a masking of resin or in the form of a hard mask based on silicon oxide or silicon nitride or composed of a stack of layers of silicon oxide and silicon nitride.

After the implantation(s), a recrystallisation of the amorphised zone is then carried out. This recrystallisation leads to an activation of the dopants (FIG. 1D).

The recrystallisation and the activation may be carried out by means of at least one thermal annealing, in particular such as implemented in a method of SPER (Solid-Phase Epitaxial Recrystallisation) type.

The thermal annealing may be carried out at a temperature chosen such as to make it possible to carry out the recrystallisation jointly with the activation of the dopants. The annealing temperature may be a low temperature, i.e. less than 600° C., and comprised for example between 400° C. and 600° C.

The zones of the superficial layer 12 which are in contact with the second layer 16 are used as starting point for a recrystallisation front (indicated by arrows in FIG. 1D) which moves in a vertical direction upwards (i.e. corresponding to the direction and to the sense of the axis z of the reference point [O,x,y,z]).

In a variant of the example which has been described above, it is possible to produce a PMOS transistor with a different stack of semiconductor materials comprising a superficial layer 12 of Si and a second semiconductor material 17 based on silicon germanium having a high concentration of germanium, for example comprised between 25 and 40%.

FIG. 2 illustrates another starting structure for carrying out a method as described previously but in which the transistor that is formed is this time of NMOS type.

In this case, the superficial semiconductor layer 12 is based on a crystalline semiconductor material 113 different from that of the first example of method, for example silicon or strained silicon. The superficial semiconductor layer 12 may then be the superficial layer of a SOI or sSOI (for strained SOI) substrate on which is formed a second semiconductor layer 16 based on a semiconductor material 117 different from that of the superficial layer 12. The semiconductor material 117 may be for example $Si_{1-y}Ge_y$, with y>0.

As in the first example of method, a difference in concentration of Ge is provided between the two semiconductor layers 12 and 16. It is thus possible to carry out a selective amorphisation of the layer 16 of $Si_{1-y}Ge_y$ richer in Ge, whereas the layer 12 of Si then corresponds to the region left crystalline.

In the case where a NMOS transistor structure is produced, the semiconductor material 117 is formed with a concentration y of Ge sufficiently low so as not to induce an untimely compressive stress in the channel zone, but sufficiently high to make it possible to obtain an amorphisation selectivity with the superficial semiconductor layer 12. The concentration y of Ge of the semiconductor material 117 may be comprised for example between 5 and 10%.

A variant of the examples of embodiment described previously is given in FIGS. 3A-3D.

For this variant, firstly a thinning is carried out of portions of the superficial semiconductor layer 12 situated on either side of the gate 20 and the spacers 15. This thinning may be carried out for example by dry etching by means of a plasma. The thinning is carried out such as to conserve a thickness $e_1$ (measured parallel to the direction defined by the axis z of the reference point [O,x,y,z] in FIG. 3A) of semiconductor material 117 which may be very low, for example of the order of 1 nm.

Then, the second layer 16 is made to grow by epitaxy of semiconductor material 117, for example SiGe on the first layer 12 (FIG. 3B). In the case of very thin thickness $e_1$ of the superficial semiconductor layer 12, it is possible to provide to reduce the epitaxy temperature in order to avoid a phenomenon of dewetting of the second layer 16.

The document "*Agglomeration control during the selective epitaxial growth of Si raised sources and drains on ultra-thin silicon-on-insulator substrates*" of C. Jahan, O. Faynot, L. Tosti, and J. M. Hartmann, Journal of Crystal Growth 280 (2005) 530-538, and in particular FIG. 1b of this document gives an example of the range of epitaxy temperatures that may be chosen as a function of the thickness of a superficial layer 12 made of Si that is provided.

A selective amorphisation of the second layer 16 is then carried out, by means of one or more implantations. The interface between the amorphous zone and the crystalline region is then advantageously situated very close to the insulating layer 11 of the substrate. This interface is further defined in a precise manner and with a low roughness. A doping of the second layer 16 is also carried out through these implantations or one or more other implantation steps (FIG. 3C).

Then, a recrystallization annealing of the material 117 is carried out (FIG. 3D). The activation of the dopants in the second layer 16 is obtained by the recrystallisation.

In this example of embodiment, the second layer 16 formed on thinned portions of the superficial layer 12 and which is doped, is advantageously situated closer to the regions of the transistor situated under the spacers 15 and the channel. It is thus possible to implement a transistor with reduced access resistances to the channel. It is possible with this configuration to increase the concentrations of dopants in a zone close to the channel while limiting the risk of not managing to properly recrystallize the regions made amorphous.

A variant of the example of method described previously is given in FIGS. 4A-4D.

For this variant, a first thinning of the superficial layer 12 is carried out, for example by anisotropic etching by means of a plasma. Portions 12a (delimited by dotted lines in FIG. 4A) of the superficial layer 12 in regions situated on either side of the spacers 15 are thus removed, while conserving intact the superficial layer 12 in a zone situated facing the spacers 15 and the gate 20.

A second thinning of the superficial layer 12 is then carried out, this time such as to removing a portion 12b (delimited by dotted lines in FIG. 4B) of regions of the superficial layer 12 situated on either side of the spacers but also a part of the superficial layer 12 situated facing the spacers 15 while conserving intact the superficial layer 12 in a zone situated facing the gate 20. This second thinning may be carried out by isotropic etching. This isotopic etching may be carried out for example by means of HCl when the superficial layer 12 is based on Si.

Figures 4A, 4B:
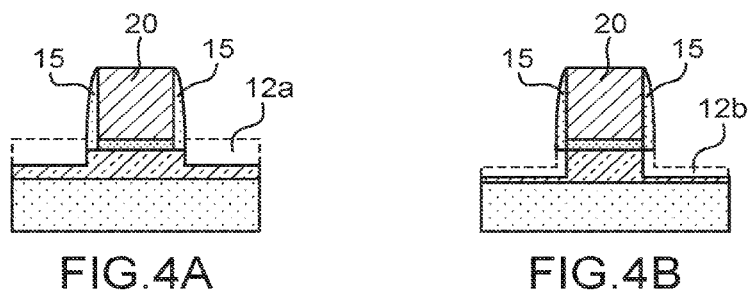
FIGS. 4A-4E illustrate a variant of embodiment in which a removal of a portion of superficial semiconductor layer under the spacers is carried out in order to bring closer the interface between amorphised zone and crystalline region of the access zones to the channel.
Figures 4C, 4D:
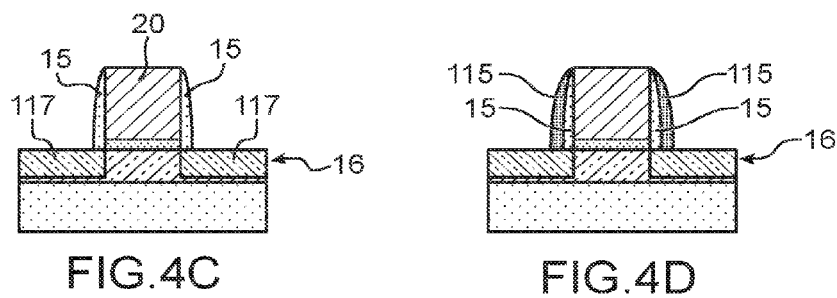

Then, a growth by epitaxy of the second semiconductor material 117 is carried out on the remaining zones of the superficial semiconductor layer 12 (FIG. 4C). This growth may be prolonged until reaching the same level as that of an upper face of the superficial layer 12 on which lies the gate 20 of the transistor. In other words, the original thickness of the superficial semiconductor layer 12 is reached. The insulating spacers 15 make it possible to protect the gate during the growth of the second semiconductor material 117.

Other insulating spacers 115 may then be formed against the insulating spacers 15. The insulating spacers 115 may also be for example based on silicon nitride (FIG. 4D). The insulating spacers 115 may have dimensions adapted as a function of specifications in terms of parasitic capacitances tolerable for the technology in which the transistor is produced.

Figure 4E:
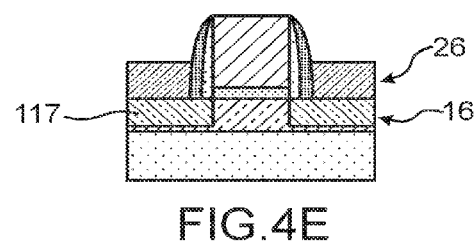

Then, a second growth by epitaxy may be carried out such as to form a third semiconductor layer 26. The thickness of the source and drain blocks is thereby increased and the upper face of the source and drain blocks is raised. This semiconductor layer 26 may be for example based on a material which may be identical to the semiconductor material 117, for example based on $Si_{1-y}Ge_y$ (FIG. 4E).

Figure 5A:
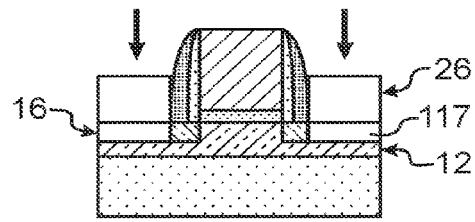
FIGS. 5A-5B illustrate a variant of embodiment of the example of method of FIGS. 4C-4E in which a selective amorphisation of several semiconductor layers is carried out after having formed additional insulating spacers.

It is then possible, after this second growth, to carry out the selective amorphisation and the doping of the second and third semiconductor layers 16, 26 by means of one or more implantations (FIG. 5A).

Figure 5B:
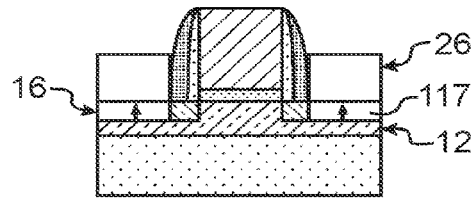

Then, a recrystallisation of the material 117 of the second and third semiconductor layers 16, 26 is carried out (FIG. 5B).

In a variant of the preceding example of embodiment (FIGS. 6A-6B), after the first growth described in relation with FIG. 4C, a selective amorphisation and a doping of the material 117 of the second layer 16 (FIG. 6A) are carried out.

Then, a recrystallisation of the material 117 of the second semiconductor layer 26 (FIG. 6B) is carried out.

Then, steps similar to those described in relation with FIGS. 4D-4E of formation of the second spacers 115 and of a third semiconductor layer 26 may be carried out.

It is then possible, after the formation of this third semiconductor layer 26 to carry out a selective amorphisation and a doping as illustrated in FIGS. 5A-5B, then to carry out a recrystallisation of the material 117 of the second and third semiconductor layers 16, 26.

For this variant, the second semiconductor layer 16 may thus be made amorphous then recrystallized several times.

Figure 7:
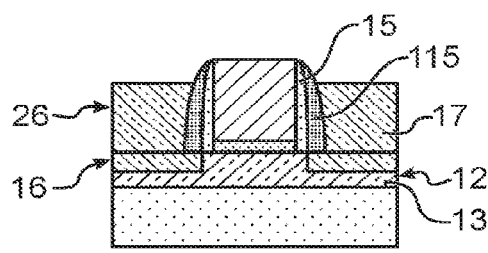
FIG. 7 illustrates a variant of embodiment of the example of method of FIGS. 4A-4E.

According to another variant, it is possible to start with a structure similar to that described in relation with FIG. 4A but provided with a superficial layer 12 based on $Si_{1-x}Ge_x$. A second semiconductor layer 16 based on $Si_{1-y}Ge_y$, then a third semiconductor layer 26 based on $Si_{1-y}Ge_y$ are then formed. It is then possible to obtain a structure such as represented in FIG. 7 from which it is possible to carry out an amorphisation of the second semiconductor material 17 which is selective with respect to the semiconductor material 13 of lower Ge concentration.

Figure 8:
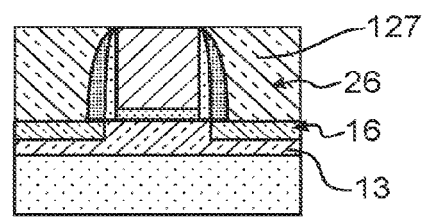
FIG. 8 illustrates a particular example of embodiment in which a selective amorphisation of a semiconductor layer based on Si:C and a layer based on SiGe is carried out with respect to a superficial layer made of silicon in which the channel of the transistor is formed.

In a variant of the step described previously in relation with FIG. 4E, it is also possible to carry out the second growth by epitaxy to form the third semiconductor layer 26 based on another semiconductor material 127 different from the semiconductor material 117 of the second semiconductor layer 16 (FIG. 8). This other semiconductor material 127 may be adapted to have a lattice parameter different from that of the second layer in order to induce a stress in the channel zone of the transistor. In the case of an N type transistor, this other semiconductor material 127 may be adapted to induce a tensile stress, for example silicon doped with carbon (Si:C).

According to a variant of the examples described previously, after having carried out the first growth by epitaxy to form the second semiconductor layer 16, it is possible to carry out a doping by selective amorphisation then recrystallisation of the second semiconductor layer 16.

Figure 9:
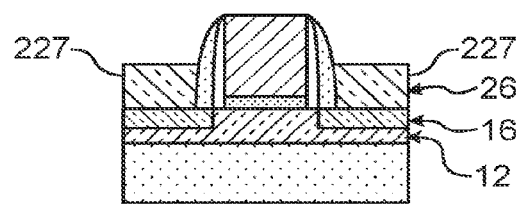
FIG. 9 illustrates a method in which the second epitaxy is in-situ doped with semiconductor layers intended to form transistor source and drain blocks.

A second growth by epitaxy of a third layer 26 of semiconductor material 227 may then be carried out while doping this semiconductor material 227. An in situ doping of the third layer 26 is thus carried out. The semiconductor material 227 of the third layer 26 may be for example silicon germanium doped with boron (SiGe:B) when the second layer 16 is based on SiGe and that the superficial layer 12 is made of Si. It is then possible to obtain a structure as illustrated in FIG. 9.

Figure 6A:
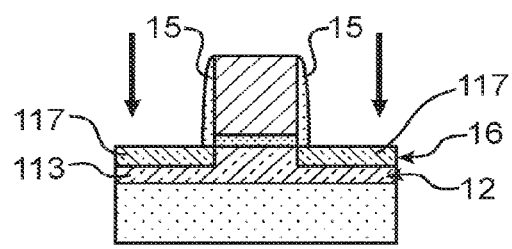
FIGS. 6A-6B illustrate a variant of embodiment in which a selective amorphisation of a semiconductor layer is carried out prior to a formation of additional insulating spacers.
Figure 6B:
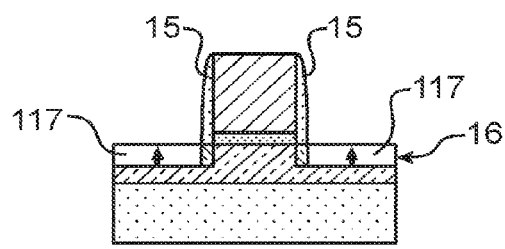

According to another variant (not represented) of one or the other of the examples of embodiment illustrated in FIG. 5A or 6A, it is possible to carry out an implantation by means of a beam inclined with respect to a normal to the superficial semiconductor layer 12. This may make it possible to amorphise and dope or to better amorphise and dope zones of the material 117 situated under the spacers.

One or the other of the methods that have been described apply for example to the production of transistors of FDSOI (for Fully Depleted Silicon On Insulator) or UTBB (for Ultra Thin Body and Box) type.

One or the other of the methods that have been described make it possible to implement a manufacture of transistors using a small thermal budget, for example less than 650° C.

The invention claimed is:

1. A method for producing a microelectronic device provided with at least one transistor formed on a semiconductor on insulator type substrate including the steps consisting in:
   providing a structure including, on an insulating layer of a semiconductor on insulator substrate: a first semiconductor layer based on a first crystalline semiconductor material, the first semiconductor material being based on $Si_{1-x}Ge_x$ (with x≥0), the first layer comprising a given zone in which a channel of the transistor is able to be produced, semiconductor blocks being arranged on either side of said zone intended to form source and drain blocks, said structure further comprising a gate block and first insulating spacers laid out on either side of the gate block and lying on said given zone of the first layer, then
   thinning the first layer on either side of said given zone,
   formation of a second layer based on a second crystalline semiconductor material different from the first semiconductor material on the thinned regions of the first layer so as to complete the formation of said source and drain blocks, the second semiconductor material being based on $Si_{1-y}Ge_y$, with 0≤x<y, with y−x>0.1,
then
   making amorphous and doping the second layer by means of one or more implantation(s), the first material, the second material, and the implantation(s) being provided so as to carry out a selective amorphisation of the second semiconductor material while conserving the crystalline structure of the first semiconductor material, an interface between the first layer and the second layer corresponding to an interface between a region made amorphous and a region of which the crystalline structure has been conserved,
   carrying out a recrystallisation of the second layer as well as an activation of dopants by means of at least one thermal annealing.

2. The method according to claim 1, further including after thinning of the first layer and prior to the formation of the second layer, a step consisting in:
   removing a thickness of the regions of the first layer on either side of the spacers and a part of the given zone situated facing the spacers.

3. The method according to claim 1, wherein the formation of the second layer includes at least one first growth by epitaxy of the second semiconductor material up to at least the level of an upper face of the given zone of the first layer on which lies the gate block.

4. The method according to claim 3, wherein after the first growth by epitaxy an amorphisation of the second semiconductor material is carried out, said amorphisation being selective with respect to the first semiconductor material.

5. The method according to claim 3, wherein after the first growth by epitaxy a second growth by epitaxy is carried out such as to form a third semiconductor layer on the second semiconductor layer.

6. The method according to claim 5, wherein after the first growth by epitaxy and prior to the second growth by epitaxy second insulating spacers are formed against the first insulating spacers.

7. The method according to claim 5, wherein during the second growth by epitaxy an in-situ doping of the third semiconductor layer is carried out.

8. The method according to claim 5, wherein after the second growth by epitaxy an amorphisation of the material of the third semiconductor layer and the second semiconductor material is carried out, said amorphisation being selective in respect with the first semiconductor material.

9. The method according to claim 5, wherein after the first growth by epitaxy and prior to the second growth by epitaxy, a doping of the second semiconductor material is carried out, the implantation(s) then being carried out after the second growth by epitaxy such as to make amorphous and to dope the third semiconductor layer and the second semiconductor layer.

10. The method according to claim 1, wherein the transistor is of NMOS type, the first semiconductor material being based on Si whereas the second semiconductor material is based on $Si_{1-y}Ge_y$, with $5\%<y<15\%$.

11. The method according to claim 10, wherein a third semiconductor layer is formed on the second semiconductor layer, the third layer being based on Si:C.

12. The method according to claim 1, wherein the transistor is of PMOS type, the first semiconductor material being based on Si whereas the second semiconductor material is based on $Si_{1-y}Ge_y$ with $y>20\%$, or
the first material is based on $Si_{1-x}Ge_x$ with $x<25\%$ and the second material is $Si_{1-y}Ge_y$ with $y>35\%$.

13. Method according to claim 12, wherein a third semiconductor layer is formed on the second semiconductor layer, the third layer being based on $Si_{1-z}Ge_z$ with $y\leq z$.

* * * * *